United States Patent
Huang et al.

(10) Patent No.: US 7,019,525 B2
(45) Date of Patent: Mar. 28, 2006

(54) METHOD AND APPARATUS FOR MAGNETIC RESONANCE IMAGING

(75) Inventors: Jinhua Huang, Florence, SC (US); Peter Jarvis, Florence, SC (US)

(73) Assignee: GE Medical Systems Glogal Technology Company, LLC, Waukesha, WI (US)

( * ) Notice: Subject to any disclaimer, the term of this patent is extended or adjusted under 35 U.S.C. 154(b) by 0 days.

(21) Appl. No.: 10/707,711

(22) Filed: Jan. 6, 2004

(65) Prior Publication Data

US 2005/0146332 A1    Jul. 7, 2005

(51) Int. Cl.
*G01V 3/00* (2006.01)

(52) U.S. Cl. ........................ 324/319; 324/320
(58) Field of Classification Search ................ 324/319, 324/320, 318, 322, 300
See application file for complete search history.

(56) References Cited

U.S. PATENT DOCUMENTS

| | | | | |
|---|---|---|---|---|
| 4,978,920 A | * | 12/1990 | Mansfield et al. | 324/318 |
| 5,359,310 A | * | 10/1994 | Pissanetzky | 335/301 |
| 5,565,831 A | * | 10/1996 | Dorri et al. | 335/216 |
| 5,581,223 A | * | 12/1996 | Ono et al. | 335/301 |
| 5,818,319 A | * | 10/1998 | Crozier et al. | 335/299 |
| 5,900,794 A | * | 5/1999 | Palkovich et al. | 335/299 |
| 6,236,203 B1 | * | 5/2001 | Shvartsman et al. | 324/309 |
| 6,246,239 B1 | * | 6/2001 | Krogmann et al. | 324/318 |
| 6,504,461 B1 | | 1/2003 | Huang et al. | 335/296 |
| 6,507,751 B1 | | 1/2003 | Blume et al. | 600/424 |
| 6,538,545 B1 | | 3/2003 | Wakuda et al. | 335/296 |

FOREIGN PATENT DOCUMENTS

| | | |
|---|---|---|
| EP | 0 251 342 A2 | 1/1988 |
| EP | 0 332 176 A2 | 9/1989 |
| EP | 0 434 247 A2 | 6/1991 |
| WO | 02/03090 A1 | 1/2002 |

* cited by examiner

*Primary Examiner*—Louis Arana
(74) *Attorney, Agent, or Firm*—Cantor Colburn LLP

(57) ABSTRACT

A magnetic field generator for producing a homogenous magnetic field region. The magnetic field generator comprises: a plurality of main magnet coils arranged in a cylindrical fashion; a plurality of shielding coils arranged in a cylindrical fashion, and located radially outward of the plurality of magnets; and wherein the main magnet coils and shielding coils are configured to shape a magnetic field which comprises at least one low fringe field region when in operation. A method for designing an MRI system that produces a low fringe field region. The method comprises: defining a solution space; defining a field of view, a center field and homogeneity requirements; defining fringe field requirements; and running an optimization algorithm to determine coil positions.

23 Claims, 5 Drawing Sheets

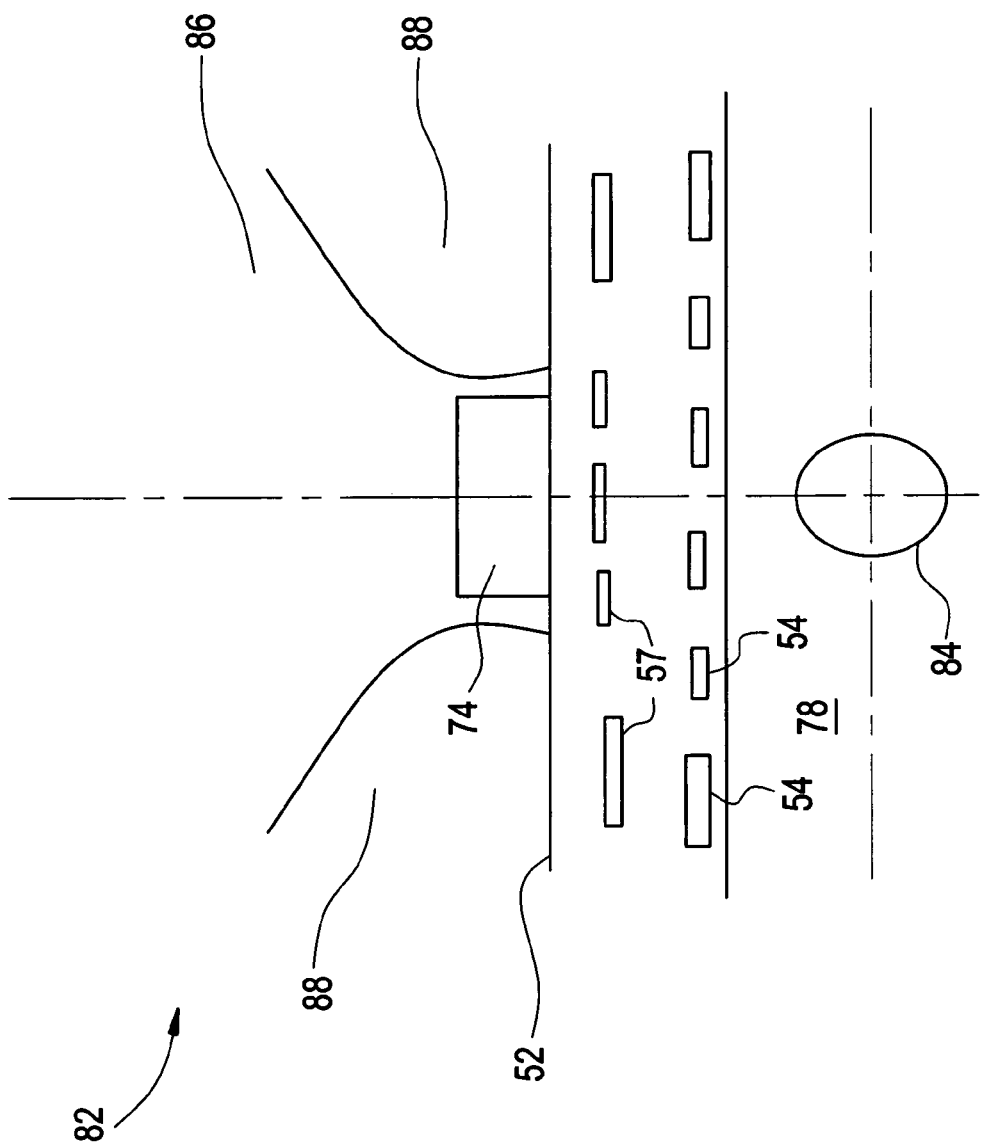

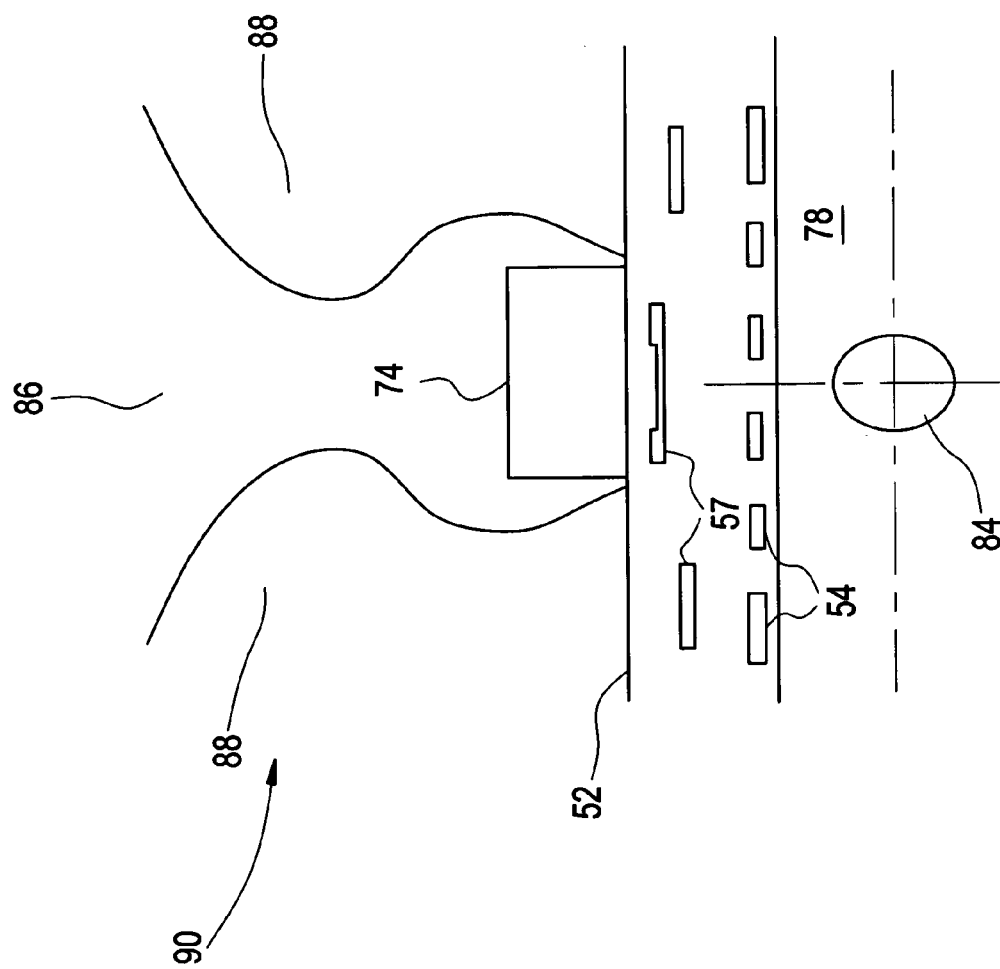

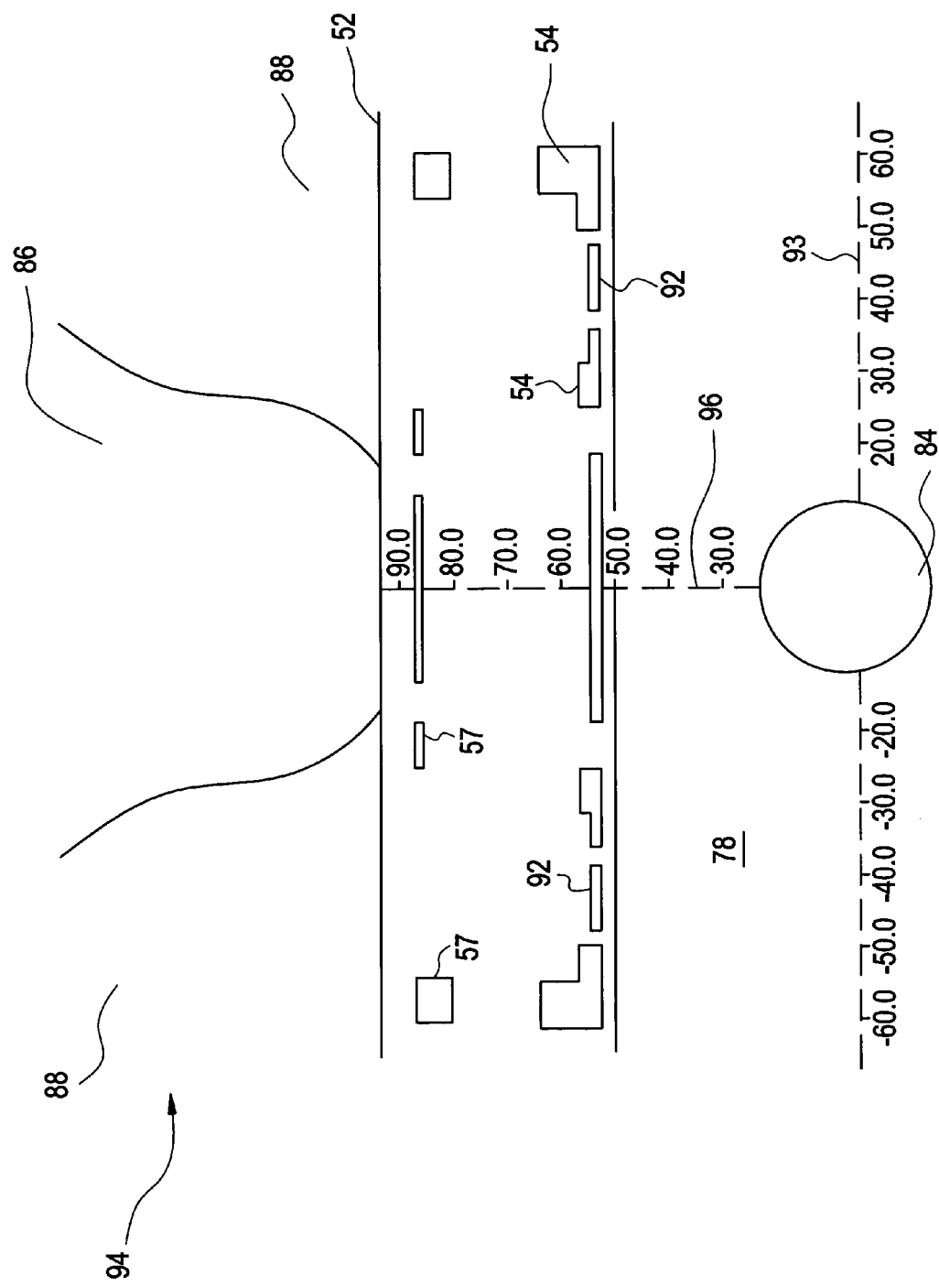

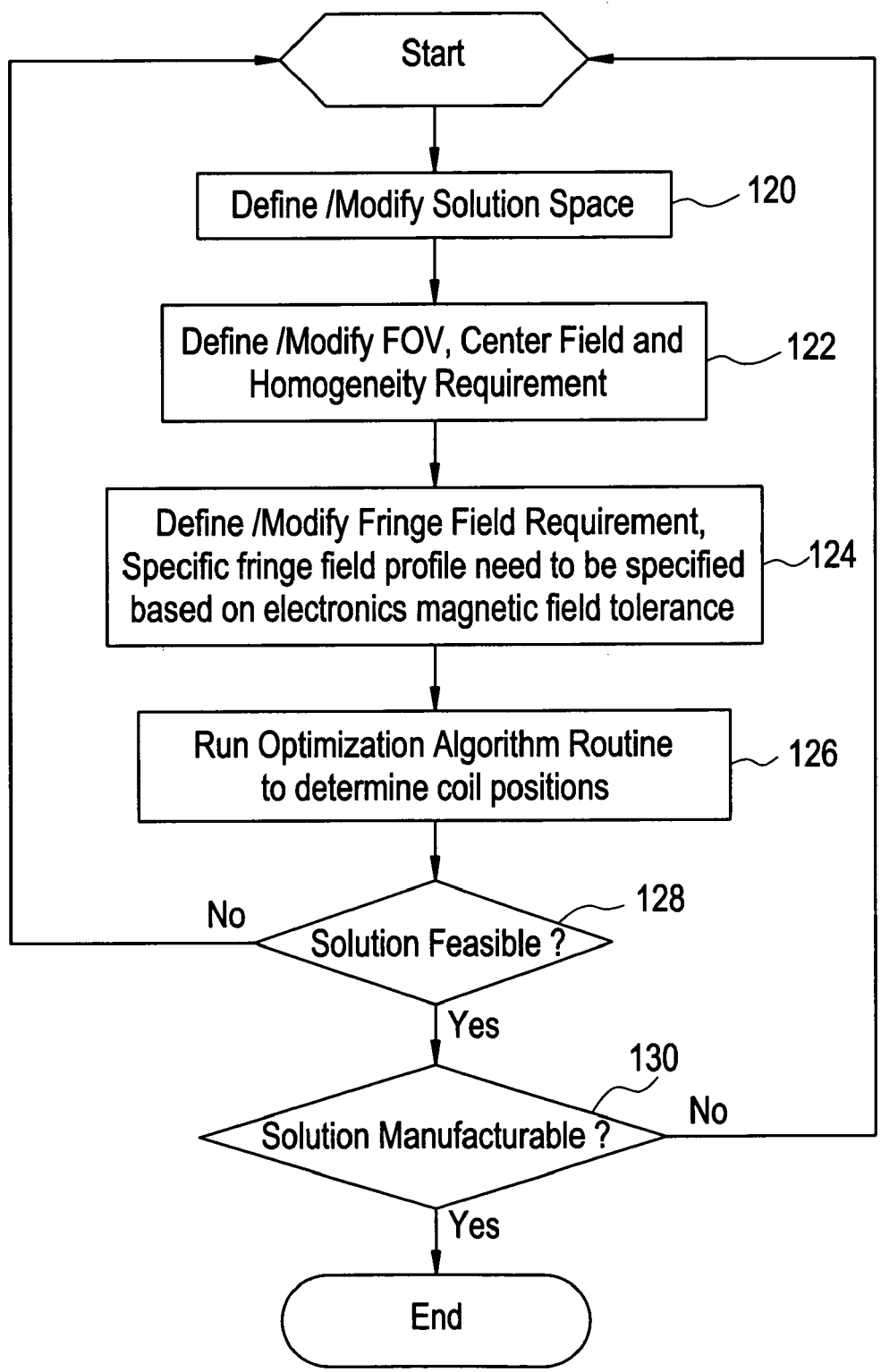

METHOD AND APPARATUS FOR MAGNETIC RESONANCE IMAGING

BACKGROUND OF THE INVENTION

The field of the invention relates to magnetic resonance imaging ("MRI") systems. More particularly, the invention relates to an MRI system that shapes a fringe magnetic field in such a way that a low fringe magnetic region is provided which will not harm electronic equipment. It will be appreciated, however, that the invention is also amenable to other like applications.

MRI is a diagnostic imaging modality that does not rely on ionizing radiation. Instead, it uses strong (ideally) static magnetic fields, radio-frequency (RF) pulses of energy and magnetic field gradient waveforms. More specifically, MRI is a non-invasive procedure that uses nuclear magnetization and radio waves for producing internal pictures of a subject. Three-dimensional diagnostic image data is acquired for respective "slices" of an area of the subject under investigation. These slices of data typically provide structural detail having a resolution of one (1) millimeter or better.

When utilizing MRI to produce images, a technique is employed to obtain MRI signals from specific locations in the subject. Typically, the region that is to be imaged (region of interest) is scanned by a sequence of MRI measurement cycles, which vary according to the particular localization method being used. The resulting set of received MRI signals are digitized and processed to reconstruct the image using one of many well-known reconstruction techniques. To perform such a scan, it is, of course, necessary to elicit MRI signals from specific locations in the subject. This is accomplished by employing gradient magnetic fields denoted $G_{SLICE}$, $G_{PHASE\ ENCODE}$, and $G_{READOUT}$ which have the same direction as a polarizing field $B_0$, but which are configured as needed to select the slice, phase encode and readout to facilitate the imaging. By controlling the strength of these gradients during each MRI cycle, the spatial distribution of spin excitation can be controlled and the location of the resulting MRI signals can be identified.

An MRI system requires not only an intensive uniform magnetic field generator, typically less than 10 ppm within a 40–50 cm diameter spherical volume ("DSV"), but also a suite of associated electronics to operate the MRI system. Traditionally, almost all of the electronics are installed outside the imaging room and connected to the Magnet/Gradient/RF system through a penetration panel. The electronics are susceptible to damage and/or malfunctions due to the magnetic field, and are therefore usually placed outside the imaging room. There are drawbacks to this arrangement. The installation of an MRI system requires complex cable routing, often in excess of 150 cables, and a penetration panel construction, both of which lead to longer installation time and added expense. Also, because the electronics needed to operate the MRI system have been installed in a separate room, the set up and configuration of the electronics and the MRI system must be done onsite after or during installation, which requires additional time and the cost of personnel to perform the onsite set up and configuration.

BRIEF DESCRIPTION OF THE INVENTION

The disclosed apparatus relates to a magnetic field generator for producing a homogenous magnetic field region. The magnetic field generator comprises: a plurality of main magnet coils arranged in a cylindrical fashion; a plurality of shielding coils arranged in a cylindrical fashion, and located radially outward of the plurality of magnets; and wherein the main magnet coils and shielding coils are configured to shape a magnetic field which comprises at least one low fringe field region when in operation.

The disclosed system relates to a magnetic resonance imaging system, the system comprises: a plurality of main magnet coils; a plurality of shielding coils located radially outward from the plurality of main magnet coils; a housing that houses the main magnet coils and the shielding coils; electronics for operating the magnetic resonance imaging system, the electronics located radially outward of the housing and proximal to the housing; and wherein the main magnet coils and shielding coils are configured such that they shape a magnetic field to comprise at least one low fringe field region when in operation.

The disclosed method relates to designing an MRI system that produces a low fringe field region. The method comprises: defining a solution space; defining a field of view, a center field and homogeneity requirements; defining fringe field requirements; and running an optimization algorithm to determine coil positions.

The disclosed apparatus also relates to a storage medium encoded with machine-readable computer program code for designing an MRI system that produces a low fringe field region, the storage medium including instructions for causing a computer to implement a method. The method comprises defining a solution space; defining a field of view, a center field and homogeneity requirements; defining fringe field requirements; and running an optimization algorithm to determine coil positions.

BRIEF DESCRIPTION OF THE DRAWINGS

Referring to the exemplary drawings wherein like elements are numbered alike in the several Figures:

FIG. 2 is a schematic of a disclosed MRI system and fringe magnetic field;

FIG. 3 is a schematic of an other embodiment of a disclosed MRI system and fringe magnetic field;

FIG. 4 is a schematic of an other embodiment of a disclosed MRI system and fringe magnetic field; and FIG. 5 is a flowchart illustrating one embodiment of a disclosed method.

DETAILED DESCRIPTION OF THE INVENTION

Figure 1:
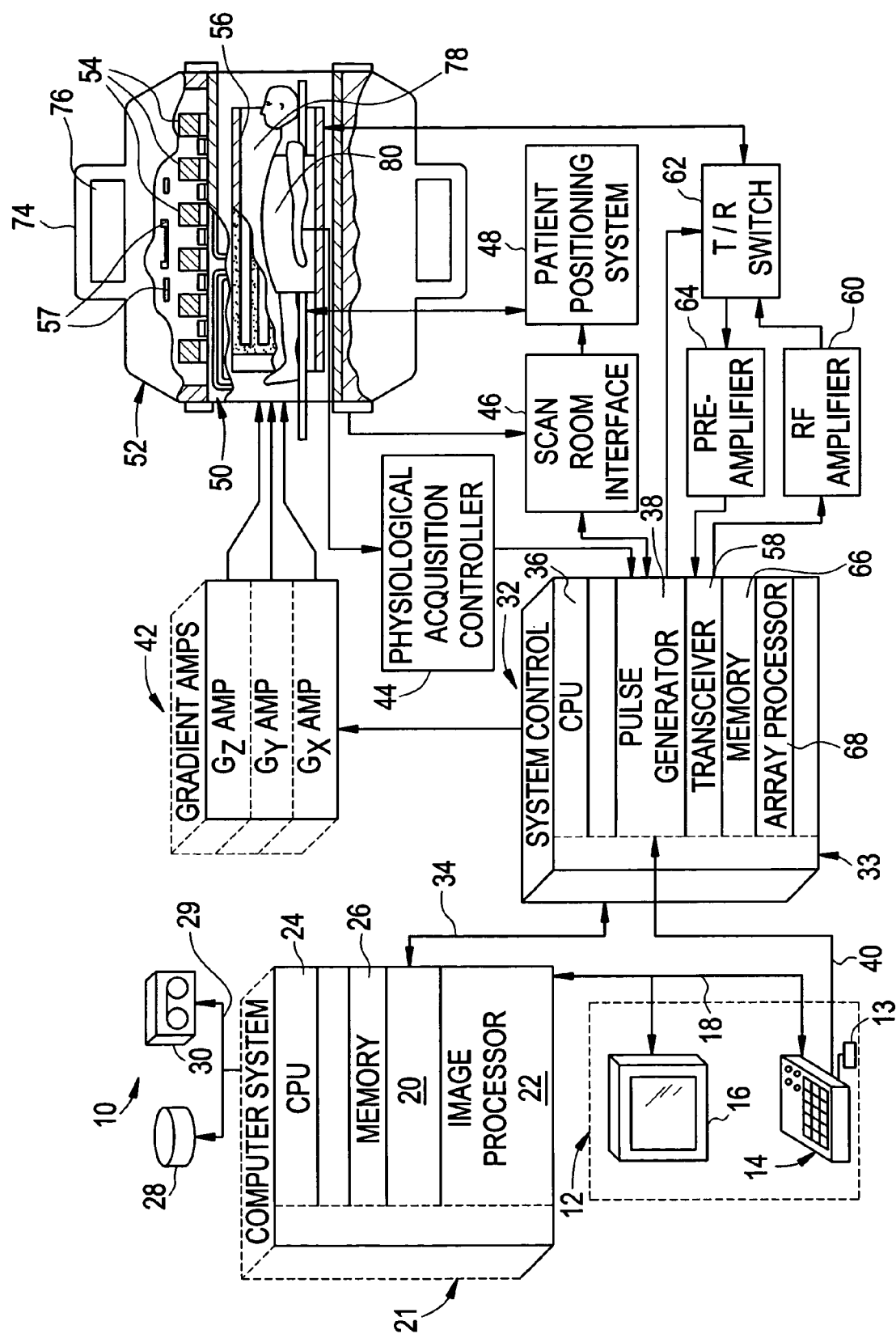
FIG. 1 depicts a disclosed MRI system.

Referring to FIG. 1, the major components of one embodiment of the disclosed MRI system 10 is shown. The operation of the system is controlled from an operator console 12, which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 21. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 33. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 (which includes the shielding coils 57 shown separately), a whole-body RF coil 56. The outer surface of the magnet assembly 52 may be referred to as a housing. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The magnetic assembly 52 may also comprise an electronics housing 74 which houses various electronics 76. Some or all of the electronics used to operate the MRI system may be installed in the electronics housing 74. Magnetic assembly 52 may additionally comprise a chamber 78 for receiving person 80.

FIG. 2 shows a schematic view of one embodiment of the disclosed MRI system 10. The magnetic assembly 52 and electronics housing 74 are shown with a fringe magnetic field 82 emanating outward in a direction away from the chamber 78. Within the chamber 78 is shown the homogenous magnetic field 84. The fringe magnetic field 82 emanates from the magnets 54 and is shaped by the orientation and position of the magnets 54 and shielding coils 57. The fringe magnetic field 82 is shaped to form a low fringe field region 86 around the electronics and may be housed with an electronics housing 74. In the embodiment shown in FIG. 2, the low fringe field region has a magnetic field strength of less than about 50 gauss. The low fringe field region may assume a toroidal shape around the magnetic assembly 52. The magnetic field strength is low enough in the low fringe field region so as to not harm the electronics 76 that may be located within the low fringe field region 86. It is in this region that the electronics may be located. The electronics may be located within a toroidal shaped volume encircling the magnetic assembly 52. There are two relatively high field regions 88 shown in FIG. 2 of greater than about 50 gauss.

FIG. 3 shows a schematic view of another embodiment of the disclosed system. In this embodiment, the shielding coils 57 and magnets 54 are configured in such a way to form the fringe magnetic field 90 shown in FIG. 3. In this embodiment, there is one low fringe field region 86 of less than about 10 gauss. Within this region is the electronics that may be located within an electronics housing 74. There are two relatively high field regions 88 shown in FIG. 3 of greater than about 10 gauss.

FIG. 4 shows another embodiment of the disclosed system. In this embodiment, the shielding coils 57, magnets 54 and negative coils 92 are configured in such a way to form the magnetic field 94 shown in FIG. 4. Negative coils 92 may be used for main field shaping in short compact magnets. In this embodiment, there is one low fringe field region 86 of less than about 50 gauss. Within this region are the electronics 76 that may be located within an electronics housing 74. There are two relatively high field regions 88 shown in FIG. 4 of greater than about 50 gauss. The homogenous magnetic field 84 in this embodiment may be about 45 to 50 cm DSV. Please note the axial scale 93 and radial scale 96 shown in FIG. 4. The units to the scales 93,96 are in centimeters, and the positions and sizes of the shielding coils, magnets and negative coils are to scale relative to the scales 93, 96.

A process for designing the magnetic assembly is described in this paragraph. In order to optimize the system by shaping the fringe magnetic field to have at least one low fringe region while still maintaining a very homogenous magnetic field, one may optimize the following formulation:

Minimize Obj=$\Sigma V_i(I_i^+ - I_i^-)$

Subject to:
$-I_{max} \leq I_i^- \leq 0$
$0 \leq I_i^+ \leq I_{max}$
$B_L \leq AX \leq B_U$ The solution space is divided into a series of small circular superconducting loops throughout the space, or a grid if viewed on the Z-R plane of a cylindrical coordinate system $(Z,R,\phi)$. $I_i^-$, $I_i^+$ are state variables for each superconducting loop. They represent the amount of current (negative or positive) in each superconducting loop. By finding the currents in each of the superconducting loops, the magnet coil geometry necessary to meet the magnet design requirements is determined. $V_i$ are the weighting factors for each of the superconducting loops in the solution space. A is the strength matrix of the superconducting loops, in terms of field contributions to each target field points, or in terms of spherical harmonics including the B0 contribution. X is a vector of all the state variables. $B_L$ and $B_U$ are the constraint lower and upper bound vectors, in terms of field (Gauss, Tesla) or harmonics (ppm). These are the actual constraints that defines the field homogeneity, the desired center field (B0), and the fringe field profile.

FIG. 5 shows a flowchart that illustrates an embodiment of a method to design a magnetic assembly with a low fringe field strength. At process block 120 the solution space that the magnetic assembly will act in is defined or modified. At process block 122 the field of view (FOV), center field, and homogeneity requirements are defined or modified. At process block 124, the fringe field requirements are defined or modified. It is in this process block that the specific fringe field profile needs to be specified based on magnetic field tolerances of any electronics that will be placed in the low strength fringe field region. At process block 126 an optimization algorithm routine is run to determine main magnet coil, shielding coil and or negative coil positions. At decision block 128, it is determined whether the optimization operation at process block 126 yields a feasible solution. At decision block 130, it is determined whether the solution generated at process block is manufactureable.

The method disclosed in FIG. 5 may be embodied in the form of computer-implemented processes and apparatuses for practicing those processes. The disclosed method may also be embodied in the form of a computer program code containing instructions embodied in tangible media, such as floppy diskettes, CD-ROMs, hard drives, or any other computer-readable storage medium 28, wherein, when the computer program code is loaded into and executed by a computer 24, the computer becomes an apparatus for practicing the invention. The present method may also be embodied in the form of computer program code, for example, whether stored in a storage medium 28, loaded into and/or executed by a computer 24, or transmitted via a data signal 29 over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

A technical contribution of the disclosed method and apparatus is that it provides for a computer assisted design of a magnet assembly which provides for a low fringe field region which will not adversely affect the electronic components' normal operation within that region.

By configuring the magnets and shielding coils such as to produce low fringe field regions that coincide with the placement of electronics used to operate the MRI system, there is an opportunity for faster and lower cost MRI system integration during installation and maintenance. Being able to place the system electronics proximate to the MRI equipment eliminates or reduces the need for access to penetration panels, complex cable routings, long cables and long installation time. The electronics 76 may comprise all or some or one of the electronic components shown in FIG. 1, and/or other electronic components not shown in FIG. 1.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. A magnetic field generator for producing a homogenous magnetic field region within a field of view, and being operable via electronics, the magnetic field generator comprising:
   a plurality of main magnet coils arranged in a cylindrical fashion and disposed within a magnet housing;
   a plurality of shielding coils arranged in a cylindrical fashion, and located radially outward of the plurality of magnets and within the magnet housing; and
   control electronics disposed with an electronics housing, the electronics housing being disposed outward of and proximal to the magnet housing;
   wherein the main magnet coils and shielding coils are configured to shape a magnetic field which comprises at least one low fringe field region when in operation, the at least one low fringe field region being at a location less than 2.5 meters radially from the center of the field of view and having a magnetic field strength low enough so as to not harm the electronics, the at least one low fringe field region including a region wherein the control electronics are located.

2. The magnetic field generator of claim 1 further comprising negative coils to help shape magnetic field in the imaging volume.

3. The magnetic field generator of claim 1, wherein the electronics comprise:
   a gradient amplifier unit;
   an RF amplifier unit;
   a system controller; and
   a magnet monitor unit.

4. The magnetic field generator of claim 1, wherein the at least one low fringe field region is less than about 50 gauss.

5. The magnetic field generator of claim 1, wherein the at least one low fringe field region is less than about 10 gauss.

6. The magnetic field generator of claim 1, wherein the at least one low fringe field region is less than about 2.5 gauss.

7. The magnetic field generator of claim 1, wherein the at least one low fringe field region comprises a toroidal volume around the housing.

8. The magnetic field generator of claim 1, wherein the electronics occupies a toroidal volume around the housing.

9. The magnetic field generator of claim 1, wherein the magnets are superconducting coils.

10. The magnetic field generator of claim 1, wherein:
the electronics housing is disposed on the magnet housing.

11. The magnetic field generator of claim 1, wherein:
the plurality of main magnet coils and shielding coils are productive of a homogeneous magnetic field that defines an isocenter; and
the at least one low fringe field region and the electronics housing are located in line and radially outboard of the isocenter.

12. A magnetic resonance imaging system comprising:
a plurality of main magnet coils;
a plurality of shielding coils located radially outward from the plurality of main magnet coils;
a housing that houses the main magnet coils and the shielding coils;
electronics for operating the magnetic resonance imaging system, the electronics located radially outward of the housing and proximal to the housing;
wherein the main magnet coil and shielding coils are configured such that they shape a magnetic field to comprise at least one low fringe field region when in operation; and
wherein the electronics are located within the at least one low fringe field region.

13. The magnetic resonance imaging system of claim 12, wherein the electronics comprise:
a gradient amplifier unit;
an RF amplifier;
a system controller; and
a magnet monitor.

14. The magnetic resonance imaging system of claim 12, wherein the at least one low fringe field region is less than about 50 gauss.

15. The magnetic resonance imaging system of claim 12, wherein the at least one low fringe field region is less than about 10 gauss.

16. The magnetic resonance imaging system of claim 12, wherein the at least one low fringe field region is less than about 2.5 gauss.

17. The magnetic resonance imaging system of claim 12, wherein at least one low fringe field region comprises a toroidal volume around the housing.

18. The magnetic resonance imaging system of claim 12, wherein the electronics occupies a toroidal volume around the housing.

19. The magnetic resonance imaging system of claim 12, wherein the magnets are superconducting coils.

20. The magnetic resonance imaging system of claim 12, wherein:
the electronics are disposed within the at least one low fringe field region; and
the at least one low fringe field region has a magnetic field strength that is low enough so as to not harm the electronics.

21. A method for designing an MRI system that produces a low fringe field region, the MRI system having a magnetic field generator operable via electronics, the method comprising:
defining a solution space;
defining a field of view, a center field and homogeneity requirements;
defining fringe field requirements such that the low fringe field region is produced at a distance less than 2.5 meters radially from the center of the field of view and has a magnetic field strength that is low enough so as to not harm the electronics; and
running an optimization algorithm to determine coil positions such that the low fringe field region, wherein the electronics may be located without being harmed, is proximal an outer surface of the magnetic field generator.

22. The method of claim 21, further comprising:
determining whether the coil positions are feasible; and
determining whether an MRI system with the coil positions is manufacturable.

23. A storage medium encoded with machine-readable computer program code for designing an MRI system that produces a low fringe field region, the MRI system having a magnetic field generator operable via electronics, the storage medium including instructions for causing a computer to implement a method comprising:
defining a solution space;
defining a field of view, a center field and homogeneity requirements;
defining fringe field requirements such that the low fringe field region is produced at a distance less than 2.5 meters radially from the center of the field of view and has a magnetic field strength that is low enough so as to not harm the electronics; and
running an optimization algorithm to determine coil positions such that the low fringe field region, wherein the electronics may be located without being harmed, is proximal an outer surface of the magnetic field generator.

* * * * *